United States Patent
Chuang et al.

(10) Patent No.: US 8,237,201 B2
(45) Date of Patent: Aug. 7, 2012

(54) LAYOUT METHODS OF INTEGRATED CIRCUITS HAVING UNIT MOS DEVICES

(75) Inventors: Harry Chuang, Austin, TX (US);
Kong-Beng Thei, Hsin-Chu (TW);
Jen-Bin Hsu, Taoyuan (TW); Chung Long Cheng, Hsin-Chu (TW); Mong Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 678 days.

(21) Appl. No.: 11/807,654

(22) Filed: May 30, 2007

(65) Prior Publication Data

US 2008/0296691 A1 Dec. 4, 2008

(51) Int. Cl.
*H01L 27/118* (2006.01)

(52) U.S. Cl. .................... 257/204; 257/E27.108

(58) Field of Classification Search .......... 257/202–211, 257/E27.001, E27.009, E27.01, E27.07, E27.105, 257/E27.107, E27.108
See application file for complete search history.

(56) References Cited

U.S. PATENT DOCUMENTS

| | | | |
|---|---|---|---|
| 4,722,910 A * | 2/1988 | Yasaitis | 438/297 |
| 4,783,692 A * | 11/1988 | Uratani | 257/206 |
| 6,066,866 A * | 5/2000 | Omori | 257/202 |
| 6,706,571 B1 | 3/2004 | Yu et al. | |
| 6,770,516 B2 | 8/2004 | Wu et al. | |
| 6,844,238 B2 | 1/2005 | Yeo et al. | |
| 6,858,478 B2 | 2/2005 | Chau et al. | |
| 6,924,560 B2 | 8/2005 | Wang et al. | |
| 7,005,330 B2 | 2/2006 | Yeo et al. | |
| 7,013,447 B2 | 3/2006 | Mathew et al. | |
| 7,074,656 B2 | 7/2006 | Yeo et al. | |
| 7,190,050 B2 | 3/2007 | King et al. | |
| 7,224,068 B2 | 5/2007 | Tseng et al. | |
| 7,247,887 B2 | 7/2007 | King et al. | |
| 7,265,008 B2 | 9/2007 | King et al. | |
| 7,462,538 B2 | 12/2008 | Li et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2003/0145299 A1 | 7/2003 | Fried et al. | |
| 2004/0119100 A1 * | 6/2004 | Nowak et al. | 257/204 |
| 2005/0023633 A1 | 2/2005 | Yeo et al. | |
| 2005/0111247 A1 | 5/2005 | Takaura et al. | |
| 2005/0136582 A1 | 6/2005 | Aller et al. | |
| 2005/0140029 A1 | 6/2005 | Li et al. | |
| 2005/0153490 A1 | 7/2005 | Yoon et al. | |

(Continued)

OTHER PUBLICATIONS

Wolf, "Silicon Processing for the VLSI Era, vol. 2—Process Integration," 1990, Lattice Press, p. 12-13.*

*Primary Examiner* — Ha Tran T Nguyen
*Assistant Examiner* — Kevin Quinto
(74) *Attorney, Agent, or Firm* — Slater & Matsil, L.L.P.

(57) ABSTRACT

A semiconductor structure includes an array of unit metal-oxide-semiconductor (MOS) devices arranged in a plurality of rows and a plurality of columns is provided. Each of the unit MOS devices includes an active region laid out in a row direction and a gate electrode laid out in a column direction. The semiconductor structure further includes a first unit MOS device in the array and a second unit MOS device in the array, wherein active regions of the first and the second unit MOS devices have different conductivity types.

16 Claims, 7 Drawing Sheets

U.S. PATENT DOCUMENTS

| | | |
|---|---|---|
| 2006/0138552 A1 | 6/2006 | Brask et al. |
| 2006/0157737 A1* | 7/2006 | Lim et al. ............... 257/203 |
| 2007/0026629 A1 | 2/2007 | Chen et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0207590 A1 | 9/2007 | Kiyotoshi et al. |
| 2008/0258228 A1 | 10/2008 | Chuang et al. |
| 2008/0290470 A1 | 11/2008 | King et al. |
| 2008/0296632 A1 | 12/2008 | Moroz et al. |
| 2008/0296691 A1 | 12/2008 | Chuang et al. |
| 2009/0181477 A1 | 7/2009 | King et al. |

* cited by examiner

LAYOUT METHODS OF INTEGRATED CIRCUITS HAVING UNIT MOS DEVICES

TECHNICAL FIELD

This invention relates generally to semiconductor devices, and more particularly to layout designs and manufacturing methods of metal-oxide-semiconductor devices.

BACKGROUND

Metal-oxide-semiconductor (MOS) devices are key components of modern integrated circuits. To satisfy the requirements of increasingly faster speed, the drive currents of MOS devices need to be increasingly greater. Since the drive currents of MOS devices are proportional to their gate widths, MOS devices with greater widths are preferred.

In addition, more functions need to be integrated into a single semiconductor chip, and hence more semiconductor devices need to be formed therein. Accordingly, semiconductor devices are required to be increasingly smaller, and device densities need to be increasingly higher. The requirements of smaller devices and higher drive currents cause the design of integrated circuits to be more and more complex. For example, high device density makes the overlay windows, which are allowable misalignment between different masks, to be small, and hence a small misalignment may cause a device failure.

The reduction in the overlay windows is further worsened by the introduction of Fin field-effect transistors (FinFET), which are widely used to increase drive currents. A FinFET includes a fin having a top surface and two sidewalls, and a gate over both the top surface and the sidewalls. Therefore, the FinFETs have increased effective gate widths since the sidewalls of the FinFETs are also used to conduct currents. However, FinFETs put an even higher requirement on the design of integrated circuits due to the process of forming and isolating fins. Particularly, FinFETs have small fins. It is thus difficult to align contacts accurately to the fins.

Additionally, conventional MOS device formation needs to form customized active regions and gate electrodes, and thus the pattern densities of the active regions, STI regions, and gate electrodes become an important issue for controlling device performance.

Accordingly, what are needed in the art are novel manufacturing methods and semiconductor device structures to simplify the design of integrated circuits.

SUMMARY OF THE INVENTION

In accordance with one aspect of the present invention, a semiconductor structure includes an array of unit metal-oxide-semiconductor (MOS) devices arranged in a plurality of rows and a plurality of columns is provided. Each of the unit MOS devices includes an active region laid out in a row direction and a gate electrode laid out in a column direction. The semiconductor structure further includes a first unit MOS device in the array and a second unit MOS device in the array, wherein active regions of the first and the second unit MOS devices have different conductivity types.

In accordance with another aspect of the present invention, a semiconductor structure includes an array of identical unit metal-oxide-semiconductor (MOS) devices arranged in a plurality of rows and a plurality of columns, wherein each of the unit MOS devices includes an active region laid out in a first direction, wherein the first direction is selected from a row direction and a column direction; and a gate electrode laid out in a second direction perpendicular to the first direction. The semiconductor structure further includes a first unit MOS device in the array, and a second unit MOS device in the array and adjacent to the first unit MOS device, wherein the first and the second unit MOS devices are aligned in the second direction; a first contact electrically connecting sources of the first and the second unit MOS devices; and a second contact electrically connecting drains of the first and the second unit MOS devices, wherein gates of the first and the second unit MOS devices are electrically connected.

In accordance with yet another aspect of the present invention, a semiconductor structure includes a first array, and a second array substantially identical to the first array, wherein the first and the second arrays each comprise identical unit metal-oxide-semiconductor (MOS) devices arranged in a plurality of rows and a plurality of columns. Each of the unit MOS devices includes an active region laid out in a first direction, wherein the first direction is selected from a row direction and a column direction; and a gate electrode laid out in a second direction perpendicular to the first direction. The semiconductor structure further includes a first plurality of contacts in the first array; and a second plurality of contacts in the second array, wherein the first plurality of contacts are laid out substantially different from the second plurality of contacts.

In accordance with yet another aspect of the present invention, a method for forming a semiconductor structure includes forming an array of unit metal-oxide-semiconductor (MOS) devices in a plurality of rows and a plurality of columns. Each of the unit MOS devices includes an active region laid out in a row direction; and a gate electrode laid out in a column direction. The method further includes forming a contact bar connecting a first source/drain region of a first unit MOS device in the array and a second source/drain region of a second unit MOS device in the array; implanting the first source/drain region with a first impurity; and implanting the second source/drain region with a second impurity having opposite conductivity type than the first impurity.

In accordance with yet another aspect of the present invention, a method of forming a semiconductor structure includes providing a layout library for forming an array comprising identical unit metal-oxide-semiconductor (MOS) devices, wherein the unit MOS devices are arranged in a plurality of rows and a plurality of columns, and wherein each of the unit MOS devices includes an active region laid out in a row direction; and a gate electrode laid out in a column direction. The method further includes using the layout library to form a first array; using the layout library to form a second array separated from the first array; forming a first plurality of contacts in the first array to form a first circuit; and forming a second plurality of contacts in the second array to form a second circuit, wherein the first plurality of contacts are laid out substantially different from the second plurality of contacts.

The advantageous features of the present invention include reduced complexity in the formation of integrated circuits, improved accuracy in the formation of contacts, and reduced loading effects.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel semiconductor structure and methods for forming the same are provided. The intermediate stages of manufacturing a preferred embodiment of the present invention are illustrated. The variations and operation of the preferred embodiments are also discussed. Throughout the various views and illustrative embodiments of the present invention, like reference numbers are used to designate like elements.

Figure 1:
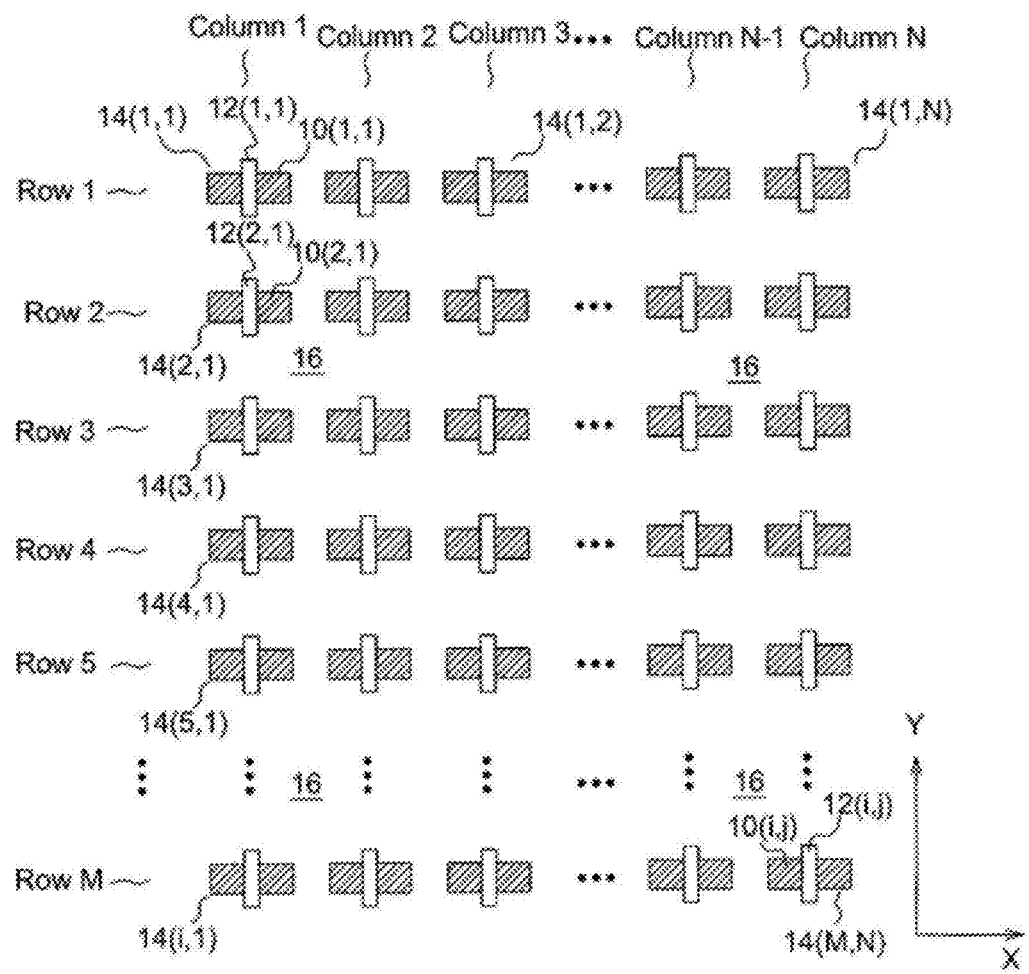
FIGS. 1 through 5 illustrate intermediate stages in the manufacturing of a embodiments of the present invention.

FIG. 1 illustrates a top view of a semiconductor structure, which includes an array of unit metal-oxide-semiconductor (MOS) devices 14. Throughout the description, an unit MOS device includes an active region (in which source and drain regions are formed), a gate dielectric, a gate electrode, and gate spacers. However, the contacts to the gate electrode and source/drain regions are not considered as part of the unit MOS device. The array has M rows and N columns, wherein M and N are integers having values of greater than one. Preferably, integers M and N are each greater than 4, and more preferably greater than about 16, and even preferably greater than about 256. Each unit MOS device in the array may be referred to according to its row number and column number. For example, the MOS device in row i and column j is referred to as 14($i, j$). Further, the features of an unit MOS device in the array may be referred to using the respective row number and column number of the unit MOS device.

Each of the unit MOS devices in the array includes an active region and a gate electrode over the active region, wherein the active region and the gate electrode are referred to as 10($i, j$) and 12 ($i, j$), respectively, assuming i and j are a row number and a column number of the unit MOS device, respectively.

Throughout the description, the gate length direction of the unit MOS devices are defined as the row direction, or X-direction in FIG. 1, while the gate width direction is defined as the column direction, or Y-direction. One skilled in the art will realize, however, that the row direction and the column direction may be interchangeably defined. Accordingly, all active regions in the array are laid out in X direction, and all gate electrodes in the array are laid out in Y direction. The active regions are isolated from each other by insulating regions 16, for example, shallow trench isolation (STI) regions or field oxides. Preferably, no other active regions exist between active regions 10.

Figure 3A:
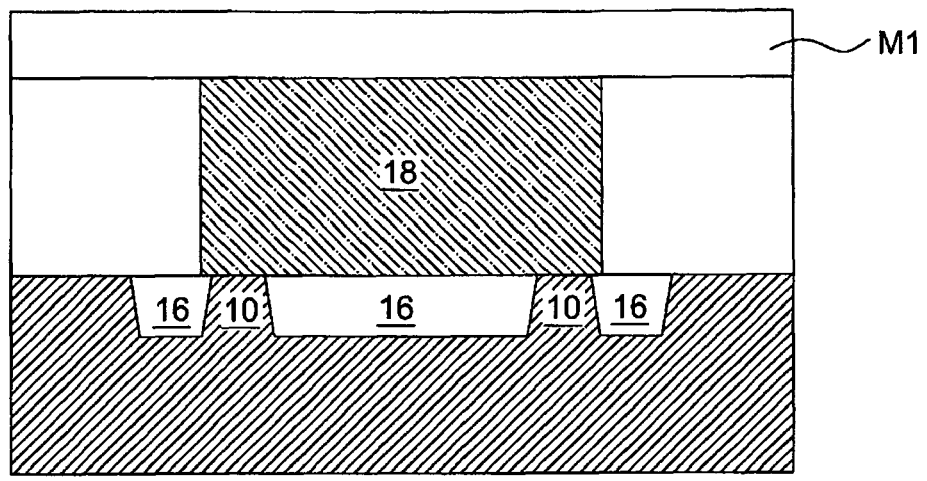
Figure 3B:
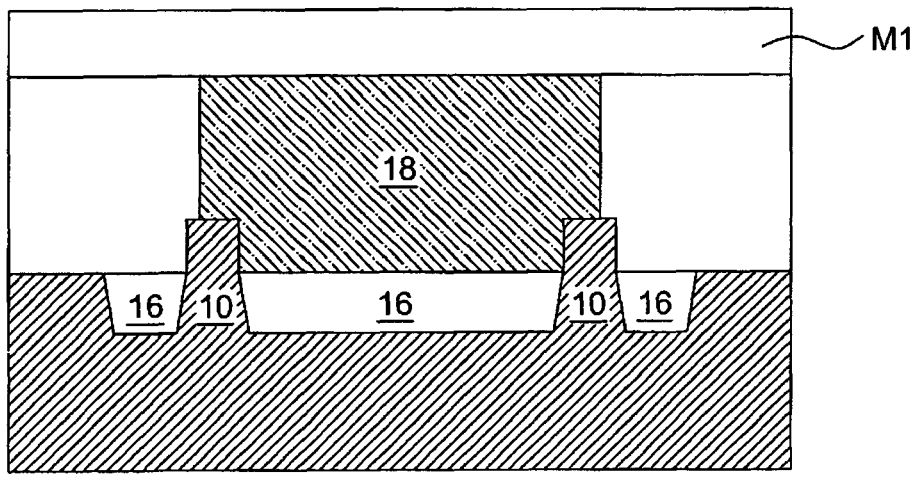

Unit MOS devices 14 in the array may be either planar MOS devices (refer to FIG. 3A) or Fin field-effect transistors (FinFET, refer to FIG. 3B). However, all unit MOS devices 14 in the array are preferably identical, that is, either all MOS devices 14 are planar devices, or all MOS devices 14 are FinFETs.

In a first embodiment of the present invention, unit MOS devices 14 are substantially identical to each other in dimensions. The active regions and gate electrodes of the unit MOS devices 14 are identical to each other in lengths and widths. In other embodiments, the active regions of some of the unit MOS devices 14 are different from other unit MOS devices 14 in the same array. In an exemplary embodiment, active regions 10 in row 2 may have a different width from active regions in row 1. Such an arrangement is advantageous in certain integrated circuits. For example, dual-port static random access memory cell may require the pull-down transistors to be twice as wide as pull-up transistors. Therefore, row 1 may be used to form pull-up transistors, while row 2 may be used to form pull-down transistors. Preferably, unit MOS devices 14 in a same row (or a column) are identical to each other, and may be different to the unit MOS devices 14 in other rows (or columns). In yet other embodiments, an array may be divided into more than one sub array, within the unit MOS devices in a same array are identical to each other in dimensions. However, from one sub array to another, the dimensions of the active regions and gate electrodes may be different.

Figure 2:
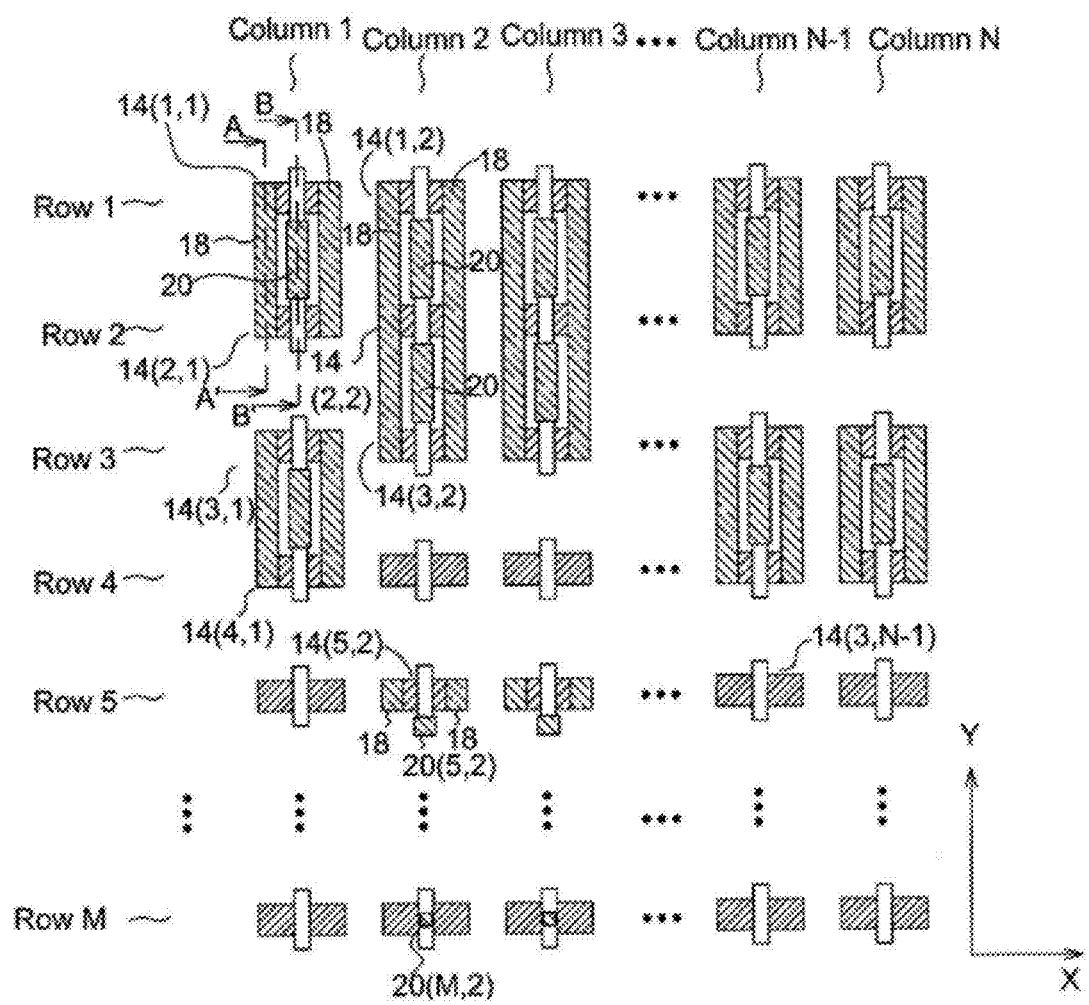

FIG. 2 illustrates the formation of contacts 18 and 20, which connect the source/drain regions and gates of unit MOS devices, respectively. An advantageous feature of the embodiments of the present invention is that the unit MOS devices in the array can be easily connected to form MOS devices with greater drive currents. For example, MOS devices 14(1, 1) and 14(2, 1) are parallel connected with their respective gates interconnected, sources interconnected, and drains interconnected. Accordingly, MOS devices 14(1, 1) and 14(2, 1) act as a single MOS device, and the drive current of the resulting MOS device is twice the drive current of each of the unit MOS devices 14(1, 1) and 14(2, 1). Similarly, all respective gates, source and drains of unit MOS devices 14(1, 2), 14(2, 2) and 14(3, 2) are interconnected, forming a MOS device having three times the drive current as each of the unit MOS devices. Advantageously, since the current flowing through the connected unit MOS devices is distributed to the unit MOS devices through contacts 18, which have a significantly higher conductivity than that of active regions, the current distribution is more uniform, and current crowding is significantly reduced.

In the preferred embodiment, contacts 18 and 20 that are used to combine unit MOS devices into greater MOS devices are all laid out in a same direction (Y direction) throughout the array. Advantageously, the overlay window in the Y direction for forming contact, which is the maximum allowable misalignment in the Y direction, is substantially increased. FIG. 2 clearly shows that misalignment in the Y direction is more unlikely to cause problem.

MOS device 14(5, 2) is an example of a single MOS device not interconnected to other MOS devices. Accordingly, its drive current is lower than the interconnected MOS devices. It is appreciated that in an integrated circuit, MOS devices with different drive currents may be needed. The embodiments of the present invention advantageously provide the flexibility to easily design MOS devices with different drive currents. Contacts to the gates of single unit MOS devices 14 may be formed directly over gate electrode, as the contact 20(5, 2), or aside of the gate electrode, as the contact 20(M, 2). Please note some of the unit MOS devices, such 14(3, N-1), do not have connected contacts, and thus these unit MOS devices are essentially dummy MOS devices.

Advantageously, contacts 18 are bar-shaped contacts, and hence have relatively greater sizes. Since the aspect ratios of contacts are becoming increasingly greater with the down scaling of integrated circuits, it is more difficult to form contact openings. Therefore, being able to increase the sizes of the contacts is a desirable feature.

FIGS. 3A and 3B are cross-sectional views of the structure shown in FIG. 2, wherein the cross-sectional view is taken along a plane crossing line A-A'. In the embodiment shown in FIG. 3A, the unit MOS devices are planar MOS devices, and hence the top surfaces of active regions 10 are substantially level with top surfaces of insulating regions 16. Contact 18 interconnects the active regions 10 of two neighboring MOS devices. Contact 18 is formed in an inter-layer dielectric (ILD) 24, and the top surface of contact 18 interfaces with the lowest metallization layer (commonly referred to as M1). For simplicity, source/drain silicide regions are not shown.

In the embodiment shown in FIG. 3B, the unit MOS devices are FinFETs, active regions 10 are thus elevated over the top surface of insulting regions 16, forming fins. Contact 18 interconnects the fins of the neighboring unit MOS devices.

Figure 4:
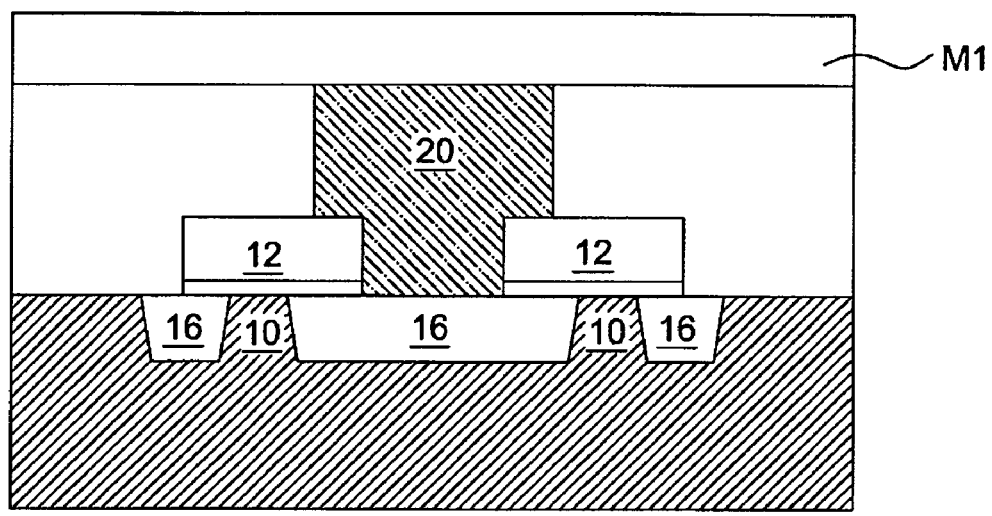

FIG. 4 is a cross-sectional view of the structure shown in FIG. 2, wherein the cross-sectional view is taken along a plane crossing line B-B'. It shows that contact 20 crosses the gates of the neighboring unit MOS devices. One skilled in the art will realize, however, that there are various alternative methods for making contacts to the unit MOS devices, and these methods are in the scope of the present invention.

Figure 5:
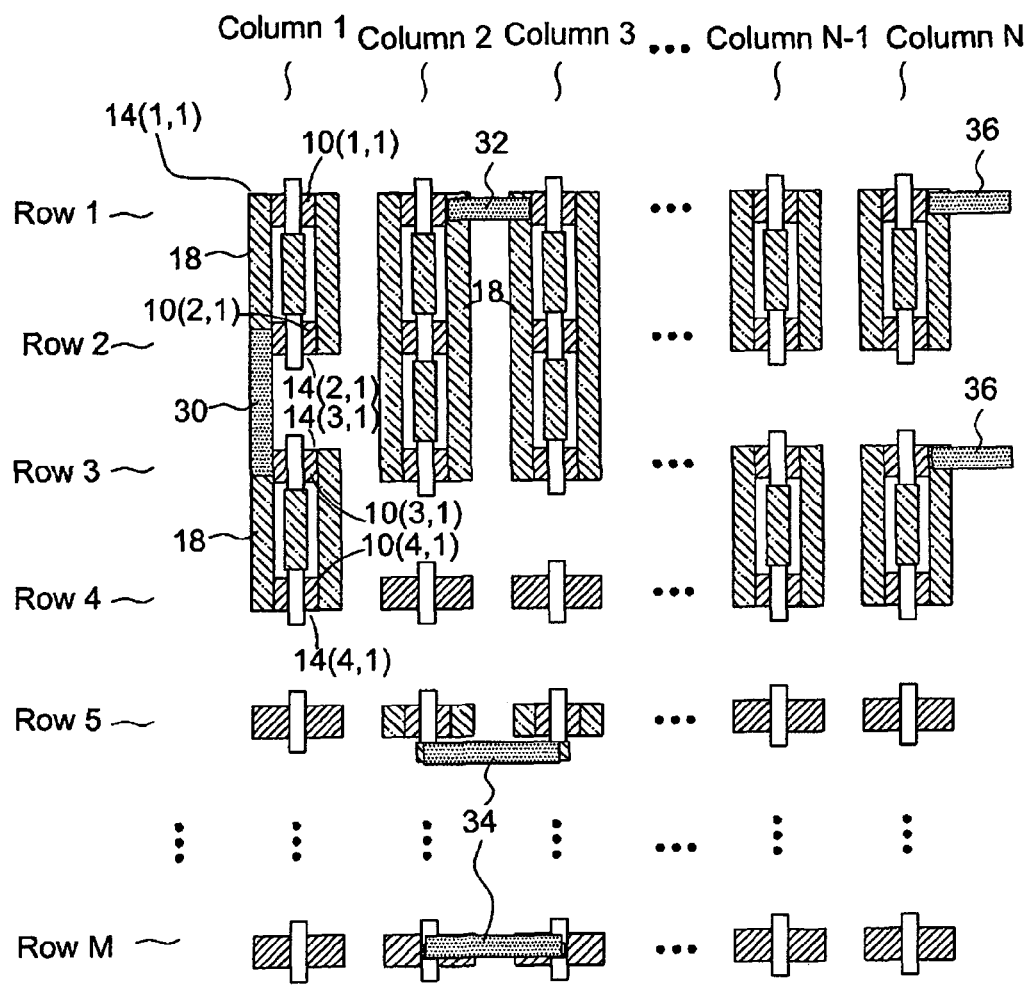

FIG. 5 illustrates the connection (referred to as contact pickup hereinafter) of contacts forming circuits. The embodiments of the present invention are suitable for forming various types of integrated circuits, including logic circuits, memory circuits, and the like. The contact pickups may be made through metal lines and vias formed in metallization layers. In an exemplary embodiment, the MOS device formed of interconnected unit MOS devices 14(1, 1) and 14(2, 1) is a PMOS device, while the MOS device formed of interconnected unit MOS devices 14(3, 1) and 14(4, 1) is an NMOS device. Accordingly, metal line 30 may be formed in metallization layer M1 to interconnect contacts 18, which are in turn connected to the active regions of the PMOS device and the NMOS device. The resulting MOS device pair is widely used in inverters and static random access memory (SRAM) cells.

Similarly, contact pickup 32 is formed to interconnect two MOS devices, each including three interconnected unit MOS devices. Contact pickups 34 illustrate how the gates of two MOS devices may be connected. Contact pickups 36 may be connected to semiconductor devices outside the array.

In an embodiment of the present invention, the active regions 10 in the array are implanted either with a p-type impurity or an n-type impurity, depending on the desired conductivity type of the MOS devices. For example, active regions 10(1, 1) and 10 (2, 1) are of p-type, while active regions 10(3, 1) and 10 (4, 1) are of n-type. In alternative embodiments, the array is divided into sub arrays (similar to the structure shown in FIG. 6), and each sub array is implanted with one type of impurity. In yet other embodiments, the unit MOS devices in different rows or columns are implanted with impurities having different conductivity types. Contact pickups are made between the sub arrays and/or rows/columns to form integrated circuits. In an exemplary embodiment, p-type sub arrays and/or rows/columns and n-type sub arrays and/or rows/columns are alternately located so that the length of contact pickups may be reduced. In yet other embodiments, a semiconductor chip includes a plurality of arrays, each having one conductivity type.

The embodiments of the present invention allow the flexibility in the design of integrated circuits. Advantageously, designers do not have to customize the shape, dimensions and orientations of active regions and gate electrodes to fit requirements of different drive currents. Instead, the structure shown in FIG. 1 may be used as a standard library, which may be plugged into the design of different integrated circuits. Designers only need to change the design of contacts and contact pickups (as illustrated in FIGS. 2 and 5) in order to design different integrated circuits having different functions. Accordingly, the masks for forming active regions, STI regions, and gate electrodes of different integrated circuits are the same. This significantly reduces the design complexity and design cost. It is realized that the embodiments of the present invention may be applied to the designs of different semiconductor chips, even though the circuits of the semiconductor chips are different. Accordingly, two semiconductor chips may have substantially identical arrays of unit MOS devices, but different circuits and functions.

Figure 6:
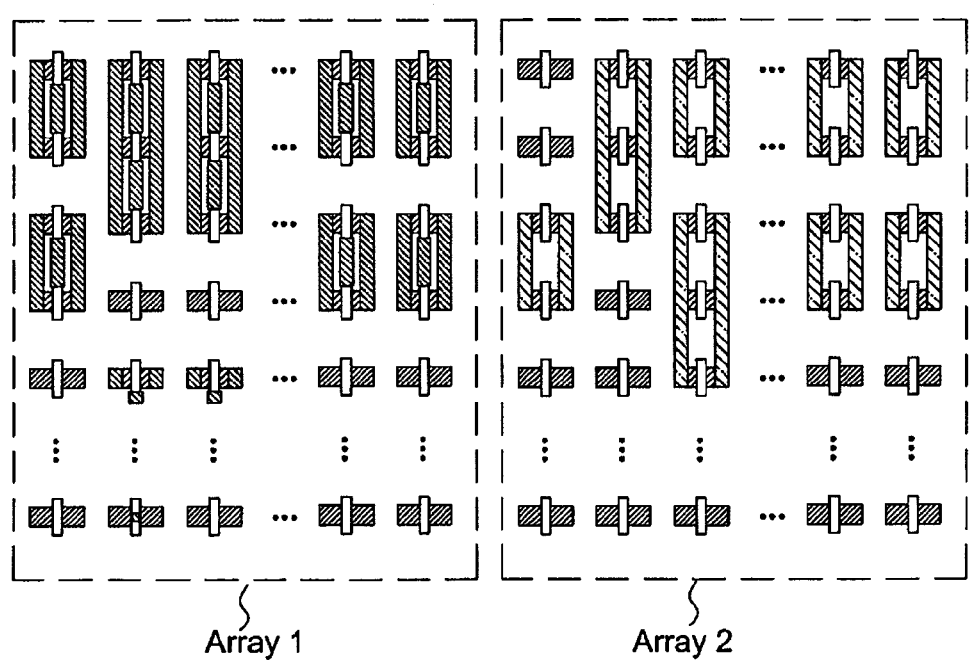
FIG. 6 illustrates an embodiment of the present invention, wherein two integrated circuits are formed using identical arrays have identical unit MOS devices.

To accommodate different design requirements, a semiconductor chip may include a different number of arrays. Each of the arrays may be designed using essentially the same specification as discussed in the preceding paragraphs. FIG. 6 illustrates two exemplary arrays, array 1 and array 2. In an embodiment, the active regions and gate electrodes in array 1 and array 2 are identical. However, arrays 1 and 2 form different integrated circuits, which is achieved by forming different contacts and contact pickups. In alternative embodiments, array 1 has different numbers of rows and/or columns from array 2.

Figure 7:
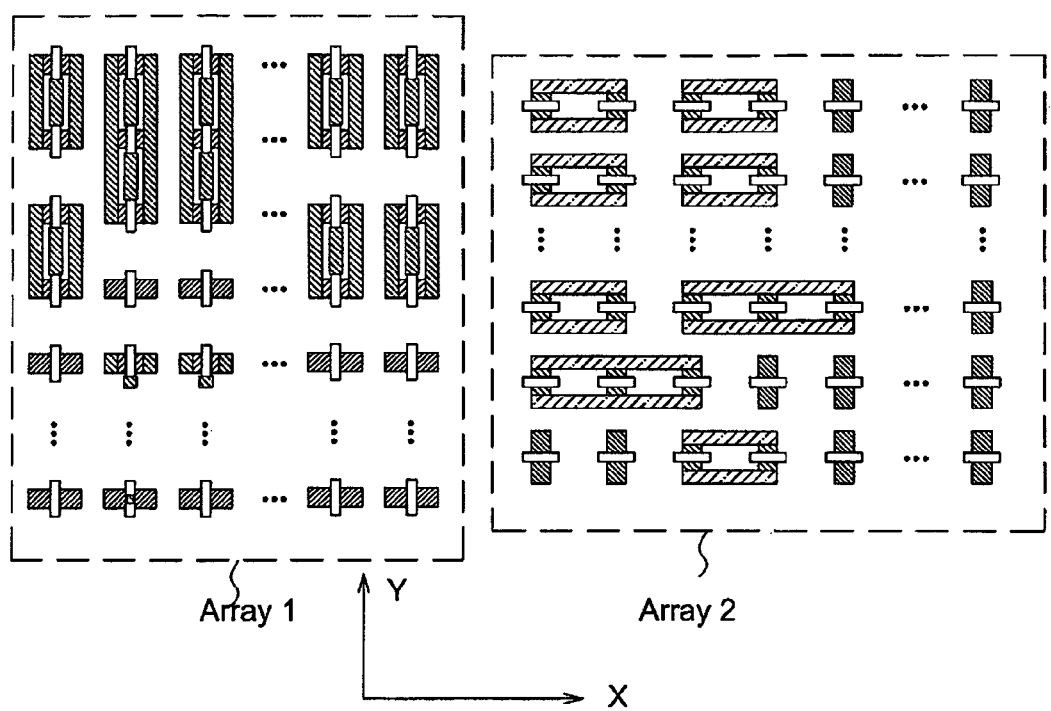
FIG. 7 illustrates an embodiment of the present invention, wherein active regions in two arrays have different orientations.

FIG. 7 illustrates yet other embodiments, wherein array 1 and array 2 have different orientations, that is, the active regions in array 1 are laid out in the/an X direction, while active regions in array 2 are laid out in the/a Y direction. In yet other embodiments, the integrated circuits in an entire chip are substantially formed of arrays, although the arrays may have different combinations of contact and contact pickup designs, array sizes, implantation types, and/or orientations.

Since the active regions and gate electrodes in the embodiments of the present invention are highly uniform, the pattern loading effects in the formation of active regions and gate electrodes are substantially eliminated. The design effort for laying out the active regions and gate electrodes is also substantially saved, since the standard library of active regions and gate electrodes can be reused from circuits to circuits, and from chips to chips. A further advantageous feature is that without the concern of loading effects and the need to route gate electrodes and active regions, the unit MOS devices can be tightly spaced, and hence the device density increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
an array of unit metal-oxide-semiconductor (MOS) devices arranged in a plurality of rows and a plurality of columns, wherein each of the unit MOS devices comprises:
an active region laid out in a row direction, wherein unit MOS devices in each row of the array have substantially identical dimensions; and
a gate electrode laid out in a column direction;
a first unit MOS device in the array;
a second unit MOS device in the array, wherein active regions of the first and the second unit MOS devices have different conductivity types;
a third unit MOS device and a fourth unit MOS device in a same column of the array and next to each other;
a first contact electrically connecting sources of the third and the fourth unit MOS devices;
a second contact electrically connecting drains of the third and the fourth unit MOS devices, wherein gates of the third and the fourth unit MOS devices are electrically connected; and
insulating regions isolating the active region of each of the unit MOS devices in the array from active regions of remaining ones of the MOS devices in the array, wherein substantially no active regions of neighboring unit MOS devices are physically interconnected as an integrated active region.

2. The semiconductor structure of claim 1, wherein all unit MOS devices in the array are identical to each other in dimensions.

3. The semiconductor structure of claim 1, wherein the array comprises a first sub region and a second sub region, and wherein unit MOS devices in the first sub region have different dimensions than unit MOS devices in the second sub region.

4. The semiconductor structure of claim 1, wherein the array comprises a first sub region and a second sub region having different numbers of unit MOS devices.

5. The semiconductor structure of claim 1, wherein all active regions of the unit MOS devices are substantially rectangular.

6. The semiconductor structure of claim 1, wherein the array further comprises a fifth unit MOS device in the same column and next to the fourth unit MOS device, and wherein the semiconductor structure further comprises:
a third contact electrically connecting sources of the fourth and the fifth unit MOS devices; and
a fourth contact electrically connecting drains of the fourth and the fifth unit MOS devices, wherein gates of the third, the fourth and the fifth unit MOS devices are electrically connected.

7. The semiconductor structure of claim 1 further comprising an additional array identical to the array, wherein contacts and contact pickups in the additional array are substantially different from contacts and contact pickups in the array, and wherein the array and the additional array form different integrated circuits.

8. The semiconductor structure of claim 1, wherein the unit MOS devices are planar MOS devices.

9. The semiconductor structure of claim 1, wherein the unit MOS devices are Fin field-effect transistors.

10. The semiconductor structure of claim 1, wherein the array is not a memory array.

11. A semiconductor structure comprising:
an array of unit metal-oxide-semiconductor (MOS) devices arranged in a plurality of rows and a plurality of columns, wherein each of the unit MOS devices comprises:
an active region laid out in a row direction; and
a gate electrode laid out in a column direction;
a first unit MOS device in the array;
a second unit MOS device in the array, wherein active regions of the first and the second unit MOS devices have different conductivity types;
a third unit MOS device and a fourth unit MOS device in a same column of the array and next to each other;
a first contact electrically connecting sources of the third and the fourth unit MOS devices; and
a second contact electrically connecting drains of the third and the fourth unit MOS devices, wherein gates of the third and the fourth unit MOS devices are electrically connected.

12. The semiconductor structure of claim 11, wherein the unit MOS devices in the array are identical to each other in dimensions.

13. The semiconductor structure of claim 11, wherein the array comprises a first sub region and a second sub region, and wherein unit MOS devices in the first sub region have different dimensions than unit MOS devices in the second sub region.

14. The semiconductor structure of claim 11, wherein the active regions of the unit MOS devices in the array are isolated from each other by insulating regions, and wherein substantially no active region exists between the active regions of the unit MOS devices.

15. The semiconductor structure of claim 11 further comprising:
a fifth unit MOS device in the same column of the array as, and next to, the fourth unit MOS device;
a third contact electrically connecting sources of the fourth and the fifth unit MOS devices; and
a fourth contact electrically connecting drains of the fourth and the fifth unit MOS devices, wherein gates of the third, the fourth and the fifth unit MOS devices are electrically connected.

16. The semiconductor structure of claim 11 further comprising an additional array identical to the array, wherein contacts and contact pickups in the additional array are substantially different from contacts and contact pickups in the array, and wherein the array and the additional array form different integrated circuits.

* * * * *